United States Patent [19]
Jordan et al.

[11] Patent Number: 4,503,405
[45] Date of Patent: Mar. 5, 1985

[54] FREQUENCY MODULATION USING A PHASE MODULATOR

[75] Inventors: Peter A. Jordan, Crawley; Michael J. Underhill, Horsham, both of England

[73] Assignee: U.S. Philips Corporation, New York, N.Y.

[21] Appl. No.: 531,200

[22] Filed: Sep. 12, 1983

Related U.S. Application Data

[63] Continuation of Ser. No. 250,514, Apr. 2, 1981, abandoned.

[30] Foreign Application Priority Data

Apr. 16, 1980 [GB] United Kingdom ............... 8012481

[51] Int. Cl.³ .............................................. H03C 3/08
[52] U.S. Cl. .................................... 332/18; 332/16 T; 455/112
[58] Field of Search .................... 332/16 R, 16 T, 18, 332/19; 455/42, 43, 44, 110, 112, 113, 119

[56] References Cited

U.S. PATENT DOCUMENTS 4,110,707  8/1978  Giolma et al. .................. 455/110 X
4,359,779 11/1982  Levine ............................ 332/18 X Primary Examiner—Eugene R. LaRoche
Assistant Examiner—W. R. Paxman
Attorney, Agent, or Firm—Joseph P. Abate

[57] ABSTRACT

A frequency modulator circuit arrangement, comprising a phase modulator (1) having a carrier signal input (2) which is fed from a carrier signal generator (18) and a modulation signal input (3) which is fed from a modulation signal input terminal (6) via an integrated circuit (7), includes a controllable frequency divider (16) in the carrier signal path through the phase modulator enabling the arrangement to operate with input modulation signals containing d.c. components without the integrator circuit output signal reaching impossibly high values. If the integrator output signal exceeds a first threshold (at terminal 26), a D-type flip-flop (27) is tripped causing a switch 28 to close, reducing the charge in the integrator capacitor (10) via a resistor (22) and hence changing the phase shift produced by the phase modulator. The division factor of the divider is simultaneously changed for one or more divisions cycles to introduce a compensating steady phase shift. Similar operations occur when the integrator circuit exceeds a second, negative, threshold (at terminal 13), a switch 20 then being closed and the division factor being simultaneously changed in the opposite direction by the output signal of a further D-type flip-flop (14).

16 Claims, 7 Drawing Figures

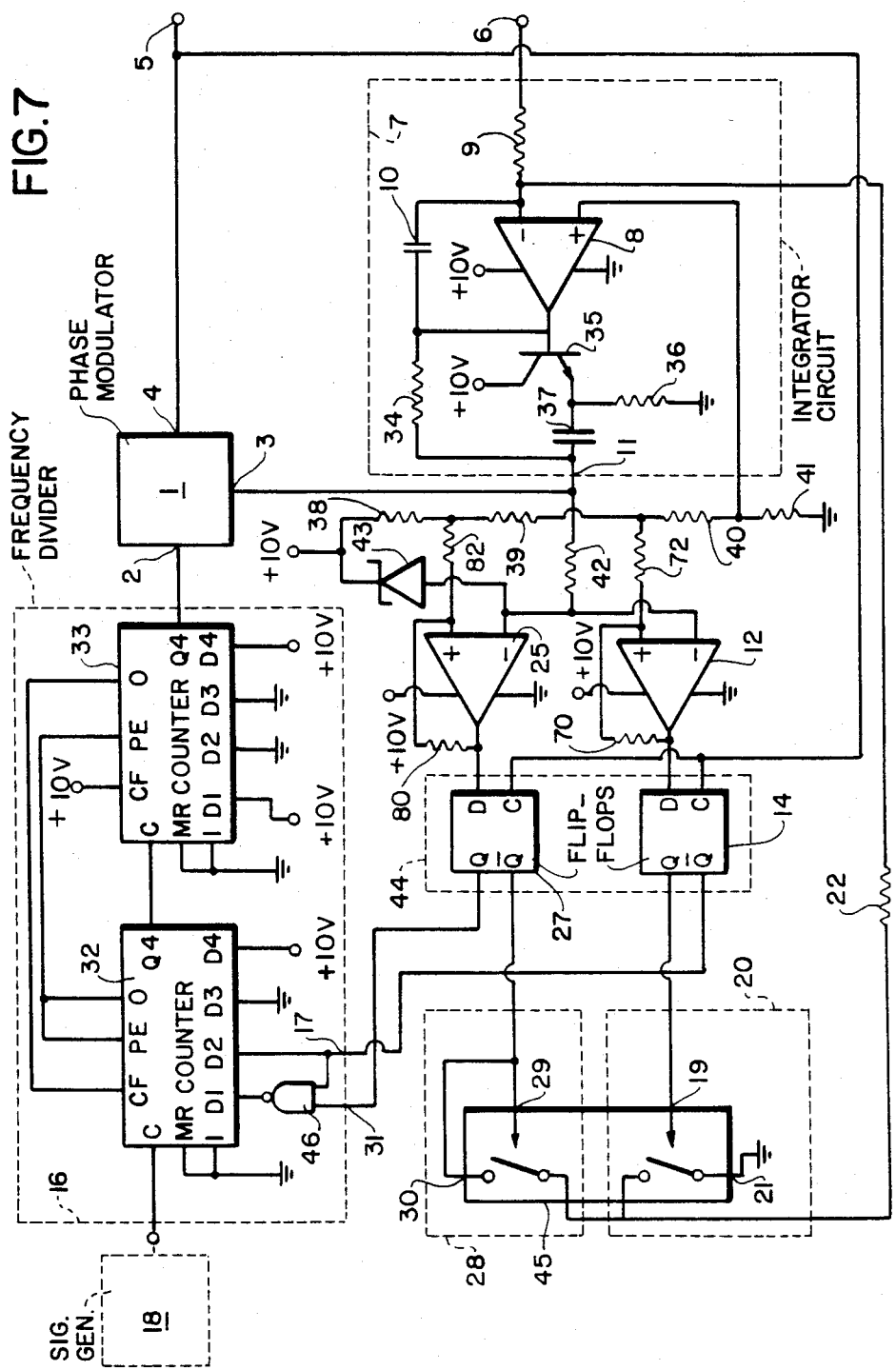

FREQUENCY MODULATION USING A PHASE MODULATOR

This is a continuation of application Ser. No. 250,514, filed Apr. 2, 1981, and now abandoned.

BACKGROUND OF THE INVENTION

The invention relates to a frequency modulator circuit arrangement comprising a phase modulator having a first input for a carrier signal, a second input for a modulation signal, and an output for the modulated carrier signal, and an integrator circuit having its output coupled to the input of the phase modulator.

Since frequency modulation is the time differential of phase modulation, a phase modulator circuit can be converted to a frequency modulator circuit by including an integrator circuit in the signal path to its modulation signal input. This fact is well-known; see, for example, the book "Information Transmission, Modulation and Noise" by M. Schwarz (McGraw Hill 1959) section 3-10, FIGS. 3-30. If a fixed frequency source (which may be crystal-stabilized) is connected to the carrier signal input of such a frequency modulator circuit, a variable-frequency signal generator circuit is obtained which can have advantages as far as stability is concerned as compared with a variable-frequency signal generator in the form of a crystal-controlled oscillator in which the frequency controlling property of the crystal is made variable by means of a varactor. However, frequency modulator circuits of the simple phase modulator plus integrator circuit kind are not very suitable for applications in which they would be required to handle quasi or actual d.c. modulation components, for example, in certain forms of signalling systems in which the modulation is in the form of a succession of stationary values. This unsuitability occurs because a d.c. modulation component implies a continuously increasing or decreasing output signal from the integrator circuit and a continuously increasing or decreasing phase shift produced by the phase modulator, and hence in an infinite dynamic range handling capability for the integrator circuit and phase modulator, unless the modulation is chosen so that the integral thereof with respect to time never exceeds (in either direction) values which can be handled by the integrator circuit and phase modulator. Choosing the modulation to satisfy this criterion in such a system tends to result in underutilization of the basic capabilities of the system. It is an object of the invention to mitigate this disadvantage.

SUMMARY OF THE INVENTION

The invention provides a frequency modulator circuit arrangement comprising a phase modulator having a first input for a carrier signal, a second input for a modulation signal, and an output for the modulated carrier signal, and an integrator circuit having its output coupled to said second input, characterized in that the arrangement includes a variable-division-factor frequency divider in a signal path to the first input of the phase modulator or in a signal path from the output of the phase modulator, and a control circuit for controlling the division factor of said frequency divider and adjusting the value of the output signal of the integrator circuit. This control circuit comprises a threshold-responsive device having an input to which the output of the integrator circuit is coupled, the control circuit being constructed to (a) control the division factor of the divider in accordance with the value of the integrator circuit output signal in such manner that the division factor is controlled to a first value in response to the output signal crossing the threshold of said device in a given direction and is controlled to a second value in response to the output signal crossing the threshold of said device in the opposite direction, and (b) adjust the output signal in the given direction by a predetermined amount, relative to the value which it would otherwise have, each time a division cycle is performed by the divider when its division factor has the second value. The first and second values have such a relationship, and the predetermined amount has such a magnitude, that the change in phase of the output signal of the frequency divider/phase modulator combination which would otherwise be produced by the performance of each division cycle when the division factor has the second value after a change in the division factor from the first value to the second value, will be substantially exactly compensated for by the change in the phase shift produced by the phase modulator occurring in response to each such adjustment of the integrator circuit output signal by the predetermined amount relative to that which it would otherwise have, at least when the divider/phase modulator combination is fed with a carrier signal having a given frequency.

The threshold-responsive device may exhibit hysteresis, i.e. a change in the division factor from the first value to the second value may occur at a different value of the integrator circuit output signal to that at which a change in the division factor from the second value to the first value occurs.

It has now been recognized that including a variable-division-factor frequency divider in the carrier signal input to, or the modulated carrier signal output from, the phase modulator, enables a fixed phase shift to be inserted in the output signal of the frequency divider/phase modulator combination when required. If, for example, the divider is fed with a fixed-phase a.c. signal and its division factor is currently N, switching the division factor to N+M for one division cycle of the divider, and then switching the division factor back to N, will result in a steady subsequent phase shift in the output signal of the divider of $2\pi M/N$ radians, this shift being a lag if M is positive and a lead if M is negative. If, while the one division cycle is occurring, the integrator output signal is changed in such a direction and by such an amount that the resulting change in the phase shift produced by the phase modulator is exactly equal and opposite to that produced by the temporary change in the division cycle of the divider, the two changes will together have no effect on the output signal of the divider/phase modulator combination. Provided that the second value is larger than the first value if a change in the integrator circuit output signal in the given direction results in the phase modulator producing an increasing phase lag or a decreasing phase lead, or that the second value is smaller than the first value if a change in the integrator circuit output signal in the given direction results in the phase modulator producing a decreasing phase lag or an increasing phase lead, the only result will be that the final value of the integrator circuit output signal will be nearer to its initial value than it would otherwise be, thereby enabling a further change in the integrator circuit output signal in the given direction to be accommodated if the input signal to the integrator circuit requires it, this possibly resulting in a further temporary change or changes in the division factor to N+M.

If the division factor is changed from the one value only in response to a change in the output signal of the integrator circuit in the given direction and it is required that the arrangement be capable of dealing with input modulation signals which vary in either direction relative to "zero", the "zero" value will have to correspond to a finite input signal to the integrator circuit. In these circumstances, a "zero" value of the input modulation signal will result in a cycling of the division factor of the divider between its first and second values, and hence in an effective output frequency from the modulator which lies somewhere between the value which it would have if the division factor permanently had the first value and the value which it would have if the division factor permanently had the second value. Such "cycling" can have a detrimental effect on the spectral purity of the arrangement output signal and, in order to prevent it from occurring under such conditions, the control circuit may comprise a further threshold-responsive device having an input to which the output of the integrator circuit is coupled and may be constructed to furthermore control the division factor of the divider in accordance with the value of the integrator circuit output signal in such manner that the division factor will be controlled to a third value in response to the output signal crossing the threshold of the further device in the opposite direction and will be controlled to the first value in response to the output signal crossing the threshold of the further device in the given direction and to adjust the output signal in the opposite direction by a second predetermined amount, relative to the value which it would otherwise have, each time a division cycle is performed by the divider when its division factor has the third value. The first value lying between the second and third values and the second predetermined amount have such a magnitude that the change in phase of the output signal of the frequency divider/phase modulator combination which would otherwise be produced by the performance of each division cycle when the division factor has the third value after a change in the division factor from the first value to the third value will be substantially exactly compensated for by the change in the phase shift produced by the phase modulator occurring in response to each such adjustment of the integrator circuit output signal by the second predetermined amount relative to that which it would otherwise have, at least when the divider/phase modulator combination is fed with a carrier signal having the given frequency, the threshold of the further threshold-responsive device having such a relationship to the threshold of the first-mentioned threshold responsive device that a change in the integrator circuit output signal thereto from the threshold of the first-mentioned threshold-responsive device will be in the opposite direction. The magnitude of the second predetermined amount may be equal to the magnitude of the first-mentioned predetermined amount.

Similar to the first-mentioned threshold-responsive device, the further threshold-responsive device may exhibit hysteresis.

The integrator circuit output signal may be adjusted in the required manner by including in the control circuit the series combination of a first controllable switch and a first resistor connecting a first point of constant potential to the integrator circuit, the series combination of a second controllable switch and a second resistor (or the first resistor) connecting a second point of constant potential to the integrator circuit, means for closing the first switch only while the division factor has its second value, and means for closing the second switch only while the division factor has its third value so that, while the division factor has its second value, current will continuously flow in the first series combination in a direction tending to change the integrator circuit output signal in the given direction and, while the division factor has its third value, current will continuously flow in the second series combination in a direction tending to change the integrator circuit output signal in the opposite direction. Adjusting the integrator circuit output signal in this way can give reasonably accurate results while being economical in respect of components required.

In order to facilitate the correct control of the division factor and of the controllable switches (if present), the control circuit may be constructed to respond to the value of the integrator circuit output signal only once during each cycle of the output signal of the frequency divider/phase modulator combination.

DESCRIPTION OF THE DRAWINGS

Embodiments of the invention will now be described, by way of example, with reference to the accompanying diagrammatic drawings, in which FIG. 7 is a schematic circuit diagram similar to FIG. 3, but showing two threshold-responsive devices having first, second and third, fourth thresholds, respectively.

DESCRIPTION OF THE PREFERRED EMBODIMENTS

Figure 1:
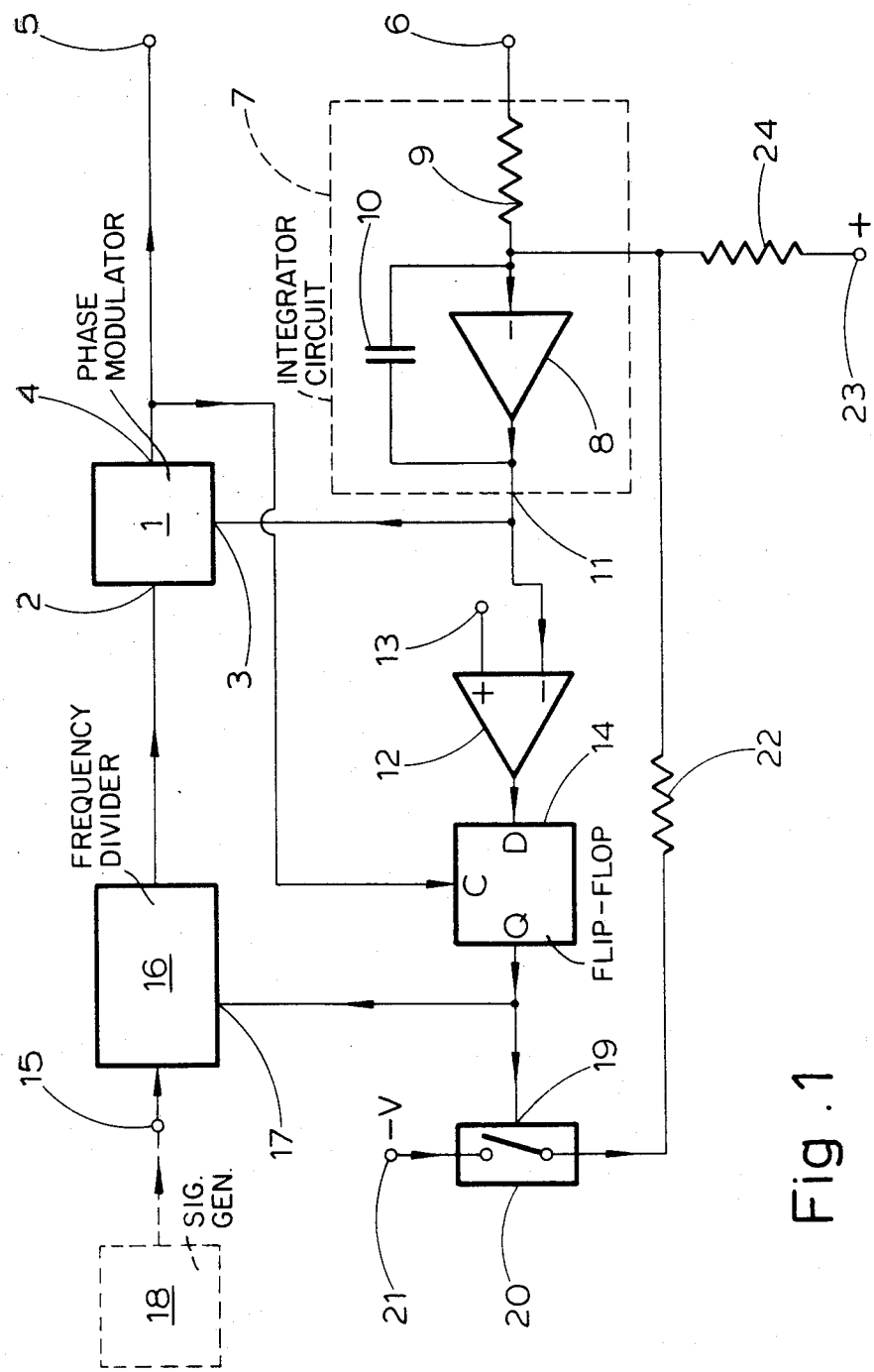
FIG. 1 is a block diagram of a first embodiment.

In FIG. 1 a frequency modulator circuit arrangement comprises a phase modulator 1 having a first input 2 for a carrier signal, a second input 3 for a modulation signal, and an output 4 for the modulated carrier signal, the output 4 being connected to the output terminal 5 of the arrangement. A modulation signal input terminal 6 of the arrangement is coupled to the modulation signal input 3 of the phase modulator 1 via an integrator circuit 7 comprising a high-gain inverting amplifier 8 to the input of which the input terminal 6 is connected via a resistor 9, and a capacitor 10 connected between the output and the input of the amplifier 8.

The output 11 of the integrator circuit 7 is also connected to the inverting input of a high-gain amplifier 12 the non-inverting input of which is fed with a steady potential (which may be zero) from a voltage source (not shown) connected to a terminal 13, so that amplifier 12 operates as a threshold-responsive device; its output is positive (logic "1") if the voltage at the output of integrator circuit 7 is less than the voltage applied to terminal 13, and is negative (logic "0") otherwise. The output of the threshold-responsive device 12 is connected to the data input of a data flip-flop 14, the clock input of which is fed from the output 4 of the phase modulator 1.

The carrier signal input 2 of the phase modulator 1 is fed from the carrier signal input terminal 15 of the arrangement via a frequency-divider 16 the division factor of which is variable between first and second values in response to the application of a control signal to a control signal input 17 thereof. Control signal input 17 is fed from the Q-output of the flip-flop 14. The output of a fixed frequency carrier signal generator 18 (shown in dashed lines) may be connected to the carrier signal input terminal 15 of the arrangement.

The Q-output of the flip-flop 14 is also connected to the control input 19 of a switching circuit 20. Switching circuit 20, when closed, connects a terminal 21 to the input of the amplifier 8 in the integrator circuit 7 via a resistor 22. Terminal 21 is fed with a negative voltage −V by means of a voltage source (not shown) connected thereto. Switching circuit 20 is constructed so that it is closed when the voltage at its control input is high (positive) and is open otherwise.

The input of the integrator circuit amplifier 8 is also fed from a terminal 23 via a resistor 24. Terminal 23 is fed with a positive voltage from a voltage source (not shown) connected thereto.

If phase modulator 1 is constructed so that a change, in the negative direction in the voltage at its modulation signal input 3 results in an increasing phase lag (or decreasing phase lead) in the signal at its output 4 relative to that at its carrier signal input 2, frequency divider 16 is constructed so that high (positive) and low voltages at its control input 17 control its division factor to have relatively high and low values, respectively. Conversely, if phase modulator 1 is constructed so that a change in the negative direction in the voltage at its modulation signal input 3 results in an increasing phase lead (or decreasing phase lag) in the signal at its output 4 relative to that at its carrier signal input 2, frequency divider 16 is constructed so that high and low voltages at its control input 17 control its division factor to have relatively low and high values, respectively. For the purposes of the next-following part of the description, it will be assumed that the former of these two possibilities is the case, that a "low" or logic "0" signal at control input 17 results in a division factor of N, that a "high" or logic "1" signal at control input 17 results in a division factor of N+M, and that the voltage applied to terminal 13 is zero.

In operation, a signal of constant frequency f is applied to input terminal 15 by source 18. Assuming that the signal at control input 17 is initially "low", a signal of frequency f/N is consequently applied to carrier signal input 2 of phase modulator 1 and appears at output terminal 5 phase-displaced by any phase shift produced in modulator 1. Assuming that the voltage applied to the inverting input of amplifier 12 is initially positive, the voltage at the output of amplifier 12 will initially be negative (logic "0"). Flip-flop 14, the clock input of which is fed from the output 4 of modulator 1, responds to each leading edge of the signal at the output of the modulator 1. For as long as the signal at the output of amplifier 12 is logic "0", the Q-output of flip-flop 14 also remains at logic "0" so that the division factor of divider 16 continuously has a value of N and the switch 20 is continuously open.

For an input modulation signal of zero at terminal 6, the voltage at the output of the integrator circuit amplifier 8 changes steadily in the negative direction because of the positive potential applied to its input from terminal 23 via resistor 24. Thus, under these conditions, phase modulator 1 produces a steadily increasing phase lag in the signal at its output 4, i.e. the signal applied to output terminal 5 has a frequency which is less than the frequency f/N of the signal applied to the carrier signal input 2 of phase modulator 1. When eventually the voltage at the output of integrator circuit 7 becomes negative, i.e. crosses the threshold of device 12 in the negative-going direction, the output voltage of amplifier 12 becomes positive. When the next leading edge appears at the output 4 of the modulator 1, the Q-output of flip-flop 14 then becomes high (logic "1") changing the division factor of divider 16 to N+M and closing switch 20. The result of the change in the division factor is that the next leading edge appears at the output of divider 16 later than it would otherwise have appeared, i.e. a phase lag (of $2\pi M/N$ radians) henceforth occurs in the output signal of divider 16. The result of closing the switch 20 is that terminal 21 (at which a potential of −V is present) becomes connected to the input of the integrator circuit amplifier 7 via the resistor 22. The values of the negative potential at terminal 21 and of the resistor 22 are so chosen that, if resistor 24 were open circuit, closure of switch 20 would result in the potential at the output 11 of integrator circuit 7 changing in a positive direction at a rate such that, when the next division cycle of divider 16 is completed, the phase lag produced by modulator 1 will have decreased by exactly $2\pi M/N$ radians. The net result of the Q-output of flip-flop 14 becoming logic "1" is therefore that, at the end of the next division cycle of divider 16, the output signal of integrator circuit 7 will be less negative (more positive) than it would otherwise have been and hence the relative phase lag produced by modulator 1 will be less than it would otherwise have been, without having any effect on the instant at which the next leading edge occurs at output terminal 5.

The values of the positive potential applied to terminal 23 and of resistor 24 are chosen relative to those of the negative potential applied to terminal 21 and of resistor 22 in such manner that each such closure of switch 20 results in an actual change in a positive direction in the output voltage of integrator circuit 7 (provided that the voltage at modulation signal input terminal 6 is zero). These values may be such that, at the end of the next division cycle of divider 16 to occur after switch 20 closes, the potential at the output 11 of integrator circuit 7 will already be positive relative to the potential applied to terminal 13, i.e. will have crossed the threshold of device 12 in a positive-going direction, resulting in the Q-output of flip-flop 14 being reset to logic "0" when the next leading edge occurs at output terminal 5, and hence in switch 20 being opened and the division factor of divider 16 being reset to N after only one division cycle with division factor N+M. Alternatively, the values may be such that this state occurs only after a plurality of division cycles has been completed with division factor N+M. In any case, the Q-output of flip-flop 14 eventually becomes logic "0" once again, after which the output signal of integrator circuit 7 changes steadily in a negative direction once again until it again becomes negative, resulting in the operations set out above being repeated.

It will be seen therefore that, when the potential at modulation signal input 6 is zero, a signal occurs at output terminal 5 with a frequency which is less than f/N by an amount determined by the rate of increase in phase lag produced by modulator 1 and the periodic change of the division factor of divider 16 to N+M. The ranges of the phase shift produced by modulator 1 alone, and the output signal of integrator circuit 7, are prevented from becoming excessive by causing the divider 16 to periodically insert a static lag in the output signal, the relative lag produced by modulator 1 being reduced accordingly each time this is done. If a positive potential is applied to terminal 6, the rate of change of the output signal of integrator circuit 7 in a negative direction is increased, resulting in the division factor of divider 16 being switched to N+M more frequently, and hence in a reduction in the frequency of the output signal at terminal 5. In a similar way, the application of a negative potential to terminal 6 results in an increase in frequency at terminal 5. Obviously the upper and lower limits of the output frequency are f/N and f(N+M), respectively. In all these cases, the provision of the adjustable divider 16 in the manner described results in the ranges of the output signal of integrator circuit 7 and the change in phase produced by modulator 1 being kept within reasonable and practical limits.

Figure 5:
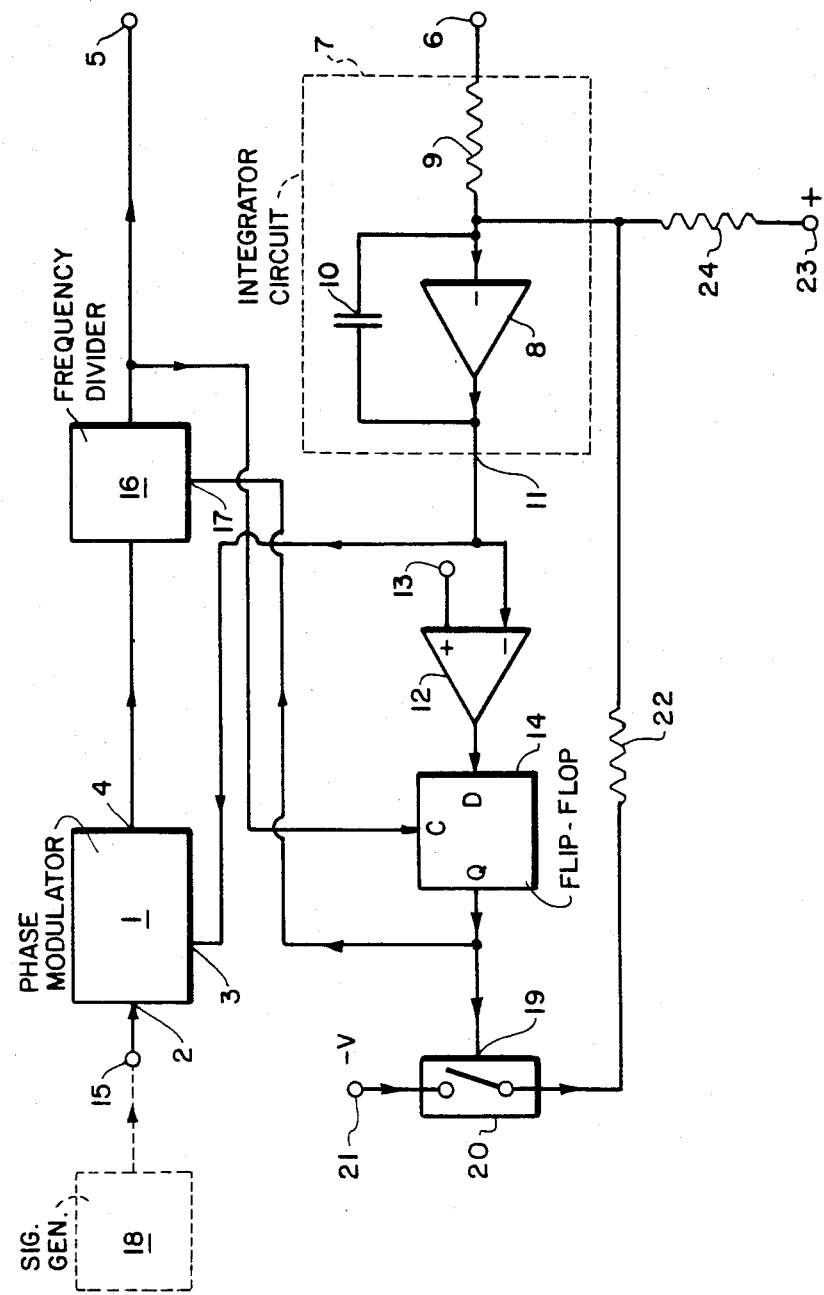
FIG. 5 is a block diagram similar to FIG. 1, but showing the frequency divider in a signal path from the output of the phase modulator.

It will be appreciated that, if a suitably chosen positive d.c. component is imposed on the modulation signal applied to terminal 6, the components 23 and 24 can be omitted. It will also be appreciated that the phase modulator 1 may be included in the signal path from the signal generator 18 to the divider as shown in FIG. 5, rather than in the signal path from the divider 16 to the output terminal 5. However, it will normally be preferred to provide the modulator 1 in the position shown in FIG. 1, as in general the maximum phase-shift it is required to produce will be less if it is in this position than if it is in the other.

Figure 2:
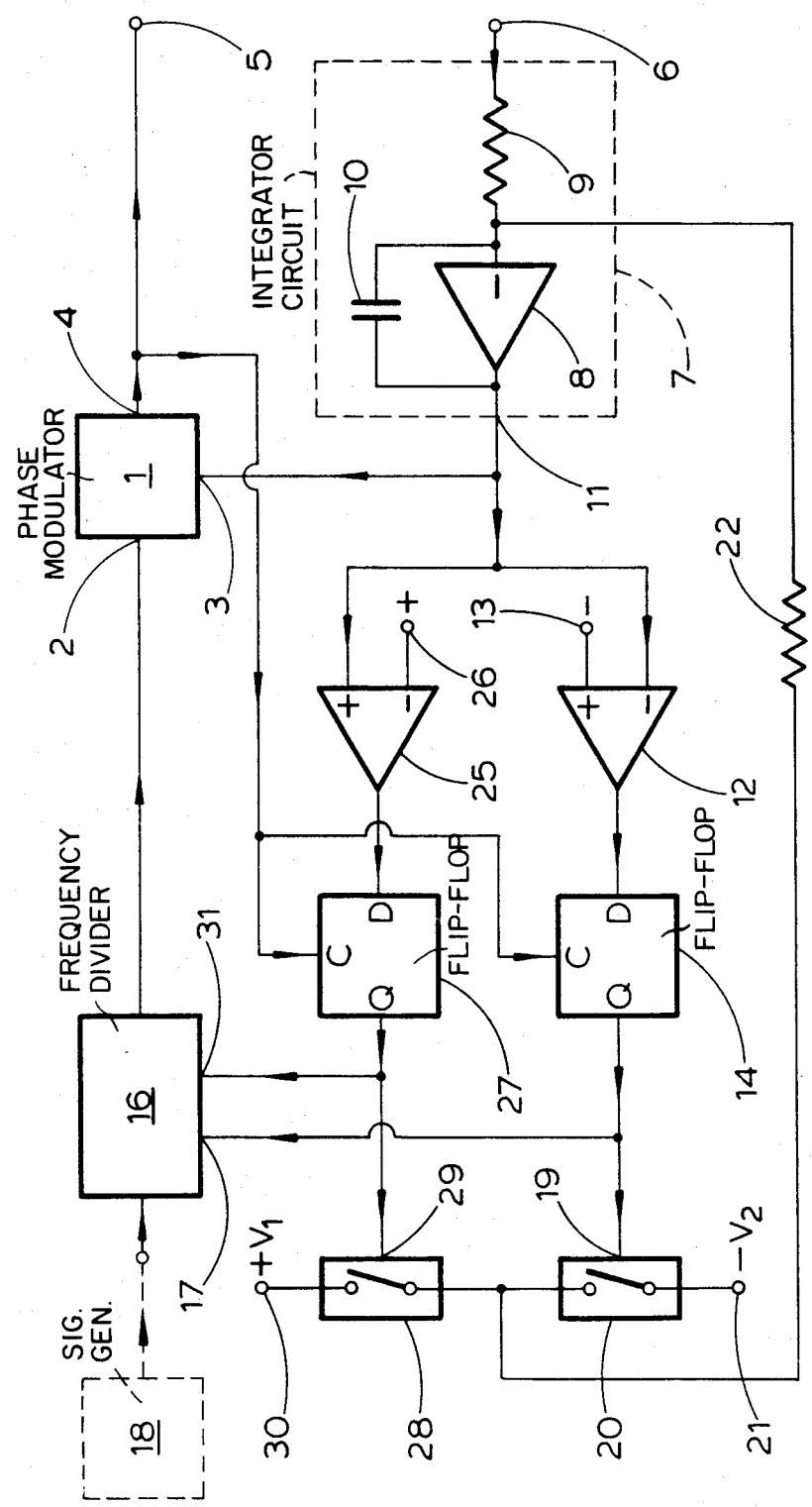
FIG. 2 is a block diagram of a second embodiment.

The fact that, with the arrangement of FIG. 1, the division factor of divider 16 cycles between its two values when the modulation signal at terminal 6 is zero can sometimes result in undesirable components in the spectrum of the output signal. FIG. 2 shows an alternative arrangement in which cycling does not occur under these circumstances.

The frequency modulator circuit arrangement of FIG. 2 (in which components corresponding to those of FIG. 1 have been given the same reference numerals) is similar to that of FIG. 1 but includes a further amplifier 25, the non-inverting input of which is fed from the output of the integrator circuit 7 and the inverting input of which is fed with a positive voltage from a voltage source (not shown) connected to a terminal 26 (the non-inverting input of amplifier 12 is, in FIG. 2, fed with a steady negative potential applied to terminal 13), a further D-type flip-flop 27, the data input of which is fed from the output of the amplifier 25 and the clock input of which is fed from the output of the phase modulator 1, and a further controllable switch 28, the control input 29 of which is fed from the Q-output of flip-flop 27. One terminal of switch 28 is fed with a positive voltage $+V_1$ by means of a voltage source (not shown) connected to a terminal 30 and the other terminal of switch 28 is commoned with the corresponding terminal of switch 20. Like switch 20, switch 28 is closed if a logic "1" is present at its control input 29 and is open otherwise. Amplifier 25 operates as a threshold device or comparator in an analogous manner to amplifier 12; if the voltage at the output of integrator circuit 7 is greater than the voltage applied to terminal 26 the output signal of amplifier 25 is high (logic "1"), otherwise it is low (logic "0"). The frequency divider 16 of FIG. 2 has a further control input 31 and is constructed so that if the signals at its control inputs 17 and 31 are both logic "0" its division factor is N, if the signals at its control inputs 17 and 31 are logic "1" and logic "0", respectively, its division factor is N+M, and if the signals at its control inputs 17 and 31 are logic "0" and logic "1", respectively, its division factor is N−M. There is no equivalent in FIG. 2 to the terminal 23 and resistor 24 of FIG. 1 for reasons which will become apparent.

If the potential at modulation signal input 6 is initially zero and remains steady, the potential at the output 11 will also be steady. Assuming that the potential at the output 11 is initially zero, then, under these conditions, the outputs of both comparators 12 and 25 are negative (logic "0") and remain so, so that the Q-outputs of both flip-flops 14 and 27 will be steadily logic "0". Both switches 20 and 28 will therefore be open and the division ratio of divider 16 will be N. The frequency of the signal at output terminal 5 will therefore be f/N, where f is the output frequency of generator 18, and this situation will continue for as long as the signal at input terminal 6 remains zero. If now a positive potential is applied to terminal 6, the signal at the output 11 of integrator circuit 7 will decrease steadily, causing phase modulator 1 to produce a steadily increasing phase lag in the signal at output terminal 5. Eventually the signal at integrator circuit output 11 will become less than the potential applied to terminal 13, i.e. will cross the threshold of device 12 in a negative-going direction, resulting in the output of amplifier 12 becoming positive (logic "1") and consequently the Q-output of flip-flop 14 becoming logic "1" when the next leading edge occurs at output terminal 5. In a similar way to that described with reference to FIG. 1, this results in the division factor of divider 16 being changed to N+M, and in the closure of switch 20, the latter resulting in the application of a negative potential $-V_2$ to the input of integrator circuit amplifier 8 via resistor 22 and, consequently, in the output signal of integrator circuit 7 increasing by an amount which causes modulator 1 to decrease the relative phase lag produced thereby by an amount which is just sufficient to compensate, at the end of the next division cycle of divider 16, for the steady phase lag introduced by the change of the division factor to N+M, less the increase in phase lag produced by the continued presence of the positive potential at terminal 6. If the positive potential at terminal 6 remains constant, the output frequency at terminal 5 will consequently be steady at a value somewhere between f/N and f/(N+M) (the actual value depending on the magnitude of the potential at terminal 6) and the output signal of integrator circuit 7 and the relative phase lag produced by modulator 1 being maintained within permissible limits by the periodic reductions therein occurring when the division factor of divider 16 is changed to N+M.

If now a steady negative potential is applied to terminal 6, the average potential at the output 11 of integrator circuit 7 will increase steadily, resulting in the phase modulator 1 producing a steadily increasing phase lead. Under these conditions the frequency of the signal at output terminal 5 is therefore greater than f/N, as required. Eventually the potential at integrator circuit output 11 becomes greater than the potential at terminal 26, i.e. crosses the threshold of device 25 in a positive-going direction, resulting in a positive (logic "1") output from comparator 25 and therefore in the Q-output of flip-flop 27 becoming logic "1" when the next leading edge occurs at output terminal 5. The result of this is that switch 28 is closed and the divison factor of divider 16 is changed to N−M. The next leading edge to occur at the output of divider 16 will therefore be phase-advanced by $2\pi M/N$ radians. Closure of switch 28 results in the positive potential $+V_1$ at terminal 30 being applied to the input of the integrator circuit amplifier 8 via resistor 22, and the value of the potential at terminal 30 is chosen so that the resulting decrease in the signal at the output 11 of integrator circuit 7 causes the relative phase lead produced by modulator 1 to be reduced relative to the value it would otherwise have at the end of the next division cycle of divider 16 by an amount which is just sufficient to compensate for the steady phase lead introduced by the change of the division factor to N−M. If the negative potential at terminal 6 remains constant, the output frequency at terminal 5 will consequently be steady at a value somewhere between f/N and f/(N−M) (the actual value depending on the magnitude of the potential at terminal 6) and the output signal of integrator circuit 7 and the relative phase lead produced by modulator 1 being maintained within permissible limits by the periodic reductions therein occurring when the division factor of divider 16 is changed to N−M.

Figure 6:
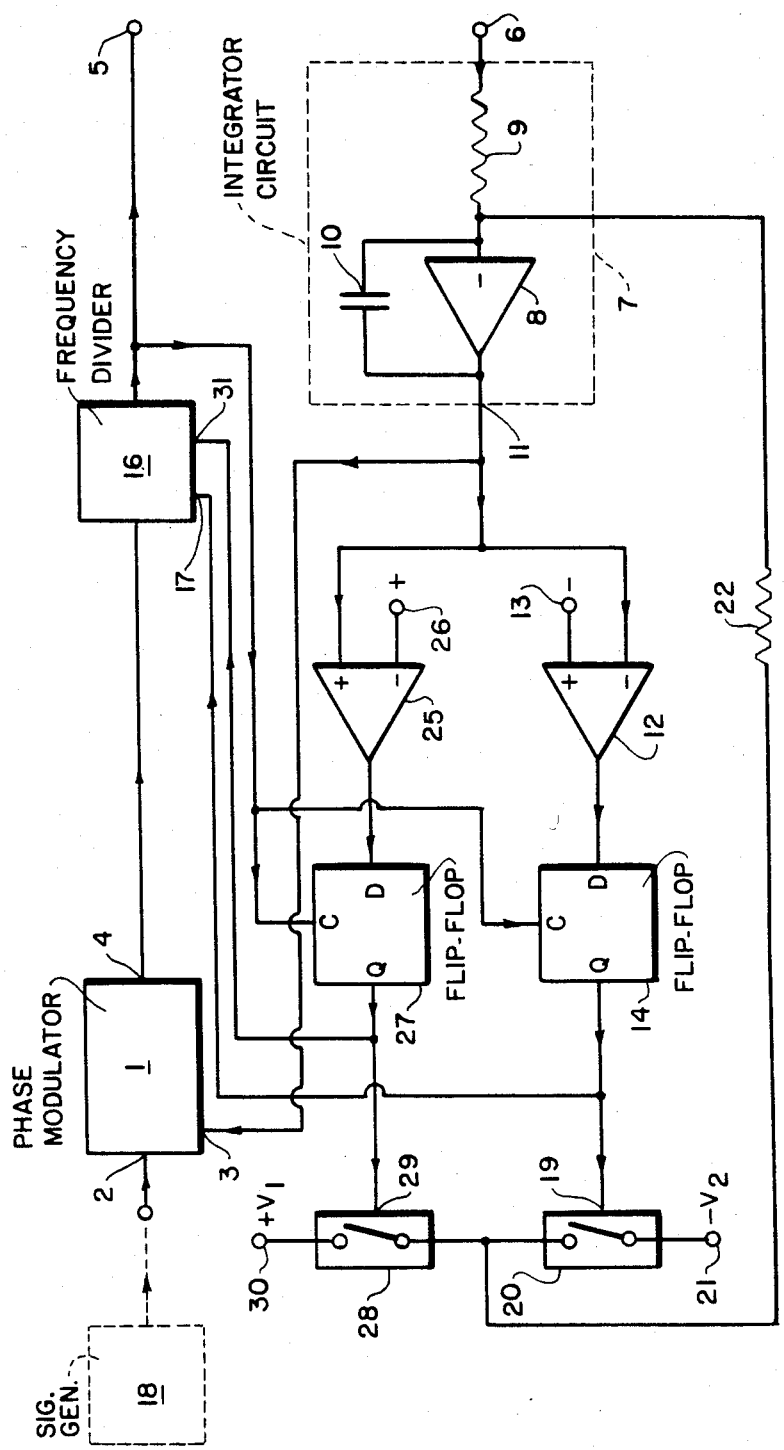
FIG. 6 is a block diagram similar to FIG. 2, but showing the frequency divider in a signal path from the output of the phase modulator.

In a similar manner to that described with reference to FIG. 1, the modulator 1 may be included in the carrier signal input path to divider 16 (see FIG. 6) rather than in the output signal path therefrom, if desired.

Although it has been assumed that the division factor of divider 16 can be changed to values which are symmetrically positioned on either side of its basic value N, such symmetrical spacing is not essential, provided that the relative magnitudes of the potentials applied to terminals 21 and 30 are chosen accordingly. If the "standard", "high" and "low" values of the output frequency of divider 16 are $f_o$, $f_h$ and $f_l$, respectively, then, in order to obtain a symmetrical response, these values should ideally be chosen so that $f_h - f_o = f_o - f_l$. In other words, if the high and low values of the division factor of divider 16 are $N+M_1$ and $N-M_2$, respectively, $M_1$ and $M_2$ should ideally be chosen so that $2M_1M_2/(M_1-M_2)=N$ if a symmetrical response is to be obtained. The voltages $V_1$ and $-V_2$ applied to the terminals 30 and 21, respectively, in FIG. 2, ideally have relative magnitudes such that $V_1/V_2 = M_2(N+M_1)/M_1(N-M_2)$, their actual magnitudes and the value of resistor 22 being chosen so that the correct amount of charge is fed to or extracted from the integrator circuit capacitor 10 each time a switch 20 or 28 is closed.

Figure 3:
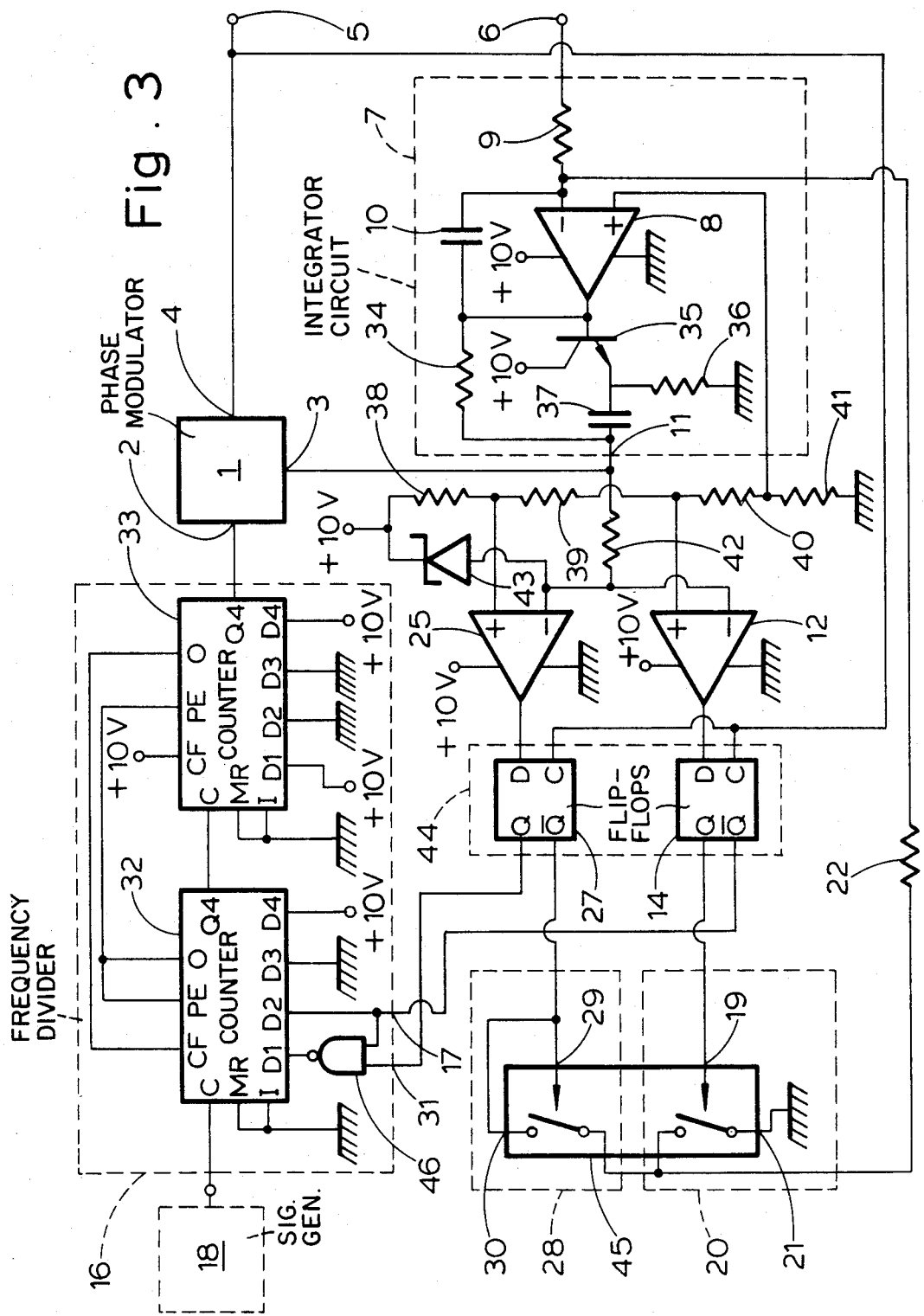
FIG. 3 shows a possible practical construction for the embodiment of FIG. 2.

FIG. 3 shows a detailed possible construction for the general arrangement of FIG. 2, minor differences existing between the operation of the arrangements of FIGS. 2 and 3 due to the fact that, in the arrangement of FIG. 3, (a) an increasing positive voltage at the output 11 of integrator circuit 7 results in an increasing phase lag (or decreasing phase lead) in the signal at output terminal 5 rather than an increasing phase lead therein and (b) the divider 16 of FIG. 3 requires a logic "1" on both of its inputs 17 and 31 if its division factor is to be N. As compared with the arrangement of FIG. 2 these minor differences necessitate the reversal of the connections to the inputs of amplifier 25 in FIG. 3, input 17 of divider 16 being fed from the $\overline{Q}$-output of flip-flop 14 rather than the Q-output thereof, and the control input 29 of switch 28 being fed from the $\overline{Q}$-output of flip-flop 27 rather than the Q-output thereof.

In FIG. 3, in which N=100 and M=1, the variable divider 16 comprises a pair of 4-bit decimal down-counters, 32 and 33, respectively, connected in cascade, the clock input of counter 32 being fed from the output of generator 18 (which generates a signal having a frequency of, for example, 1 MHz) and the clock input of counter 33 being fed from the Q4 output of counter 32. The Q4 output of counter 33 constitutes the output of divider 16. Each counter is of the type commercially available under the type number MC 14522. If its parallel-enable or load input PE is logic "0", each counter normally repeatedly cycles through ten count positions corresponding to the sequence 9, 8, ... 1, 0 when clock pulses are applied to its clock input, a logic "1" appearing at its terminal count output "0" each time it reaches a count of zero if and only if its "carry forward" input CF is then logic "1" (positive). However, application of a logic "1" to the parallel load input PE of each counter causes a four-bit binary number (which may in principle have any value up to fifteen) presented to its data input D1, D2, D3 and D4 to be asynchronously loaded into the counter, the counter then counting down from this number and then returning to its decimal cycle. The data input of counter 33 is permanently fed with binary 9 (1001). If both inputs 17 and 31 of divider 16 are fed with logic "1", the data input of counter 32 is fed with binary 10 (1010). If inputs 17 and 31 of divider 16 are fed with logic "1" and logic "0", respectively, the data input of counter 32 is fed with binary 11 (1011). If inputs 17 and 31 of divider 16 are fed with logic "0" and logic "1", respectively, the data input of counter 32 is fed with binary 9 (1001). It will be seen, therefore, that divider 16 divides by 100, 101 and 99 when inputs 17 and 31 are logic "1" and logic "1", logic "1" and logic "0", and logic "0" and logic "1", respectively, these three cases corresponding to flip-flops 14 and 27 being in the reset and set states, in the reset and reset states, and in the set and set states, respectively.

In FIG. 3, the output of the integrator circuit amplifier 8 (which may be of the kind available under the type number CA 3160) feeds the modulation signal input of the modulator 1 and the threshold amplifiers 12 and 25 both via a resistor 34 and via an emitter follower 35, a resistor 36 and a capacitor 37. The emitter follower is provides so that the input 3 of modulator 1 "sees" a low a.c. impedance at the output 11 of integrator circuit 7. The non-inverting input of amplifier 8 is fed from the positive supply rail via a potential divider comprising resistors 38, 39, 40 and 41. The potential thereat is +5 V. The integrator output signal is stationary if the potential at the inverting input is also +5 V.

The non-inverting inputs of the comparator (or threshold) amplifiers 25 and 12 (each of which may be of the kind available under the type number TCA 520B) are fed from the junction of the divider resistors 38 and 39, and 39 and 40, respectively. Their inverting inputs are fed from the output 11 of the integrator circuit 7 via a resistor 42, and are also connected to the positive supply rail (+10 V) via a zener diode 43 for voltage swing limiting purposes. Diode 43 may be of the kind available under the type number BZY 88-C5V1.

Flip-flops 14 and 27 are constituted by a single integrated circuit 44 available under the type number HEF 4013.

Controllable switches 20 and 28 are constituted by half a single integrated circuit 45 available under the type number HEF 4016.

The control inputs 17 and 31 of the divider 16 are coupled to the D1 bit portion of the data input of counter 32 via a NAND-gate 46. The NAND-gate 46 may be a quarter of an integrated circuit available under the type number HEF 4011.

Transistor 35 may be of the kind available under the type number BC 549.

The various resistors and capacitors may have the following values:

| Resistor 9 | 1 M | Capacitor 10 22 nF (1% polystyrene) |
|---|---|---|
| Resistor 22 | 10K (1%) | Capacitor 37 330 nF |
| Resistor 34 | 1K | |
| Resistor 36 | 8K2 | |
| Resistor 38 | 1K | |
| Resistor 39 | 5K6 | |
| Resistor 40 | 3K9 | |
| Resistor 41 | 10K | |
| Resistor 42 | 2K7 | |

The above component values are appropriate when the sensitivity of the phase modulator 1 is 0.0277 radians/volt.

The arrangement of FIG. 3 operates in a similar manner to that described with reference to FIG. 2. So long as the output signal of integrator circuit 7 lies between the voltages applied to the non-inverting inputs of the comparator amplifiers 12 and 25, flip-flops 14 and 27 are in the reset and set states, respectively, so that both switches 20 and 28 are open, terminals 17 and 31 of divider 16 are both logic "1", and the division factor of divider 16 is 100. If the output signal of integrator circuit 7 should fall below the potential applied to the non-inverting input of comparator amplifier 12 (corresponding to the production of a considerable relative phase led by modulator 1), flip-flop 14 is set when the next positive edge occurs at output terminal 5. This in turn, closes switch 20, causing the output of the integrator circuit 7 to increase, and changes the division factor of divider 16 to 99. Likewise, if the output signal of integrator circuit 7 should rise above the potential applied to the non-inverting input of comparator amplifier 25 (corresponding to the production of a considerable relative phase lag by modulator 1), flip-flop 27 is reset when the next positive edge occurs at output terminal 5. This in turn closes switch 28, causing the output of the integrator 7 to decrease, and changes the division factor of divider 16 to 101.

The modulation signal applied to terminal 6 may have a range from zero to 10 volts, the "zero" value thereof corresponding to +5 volts. The positive edges of the frequency-modulated 10 KHz output signal at terminal 5 have the true desired phase.

Figure 4:
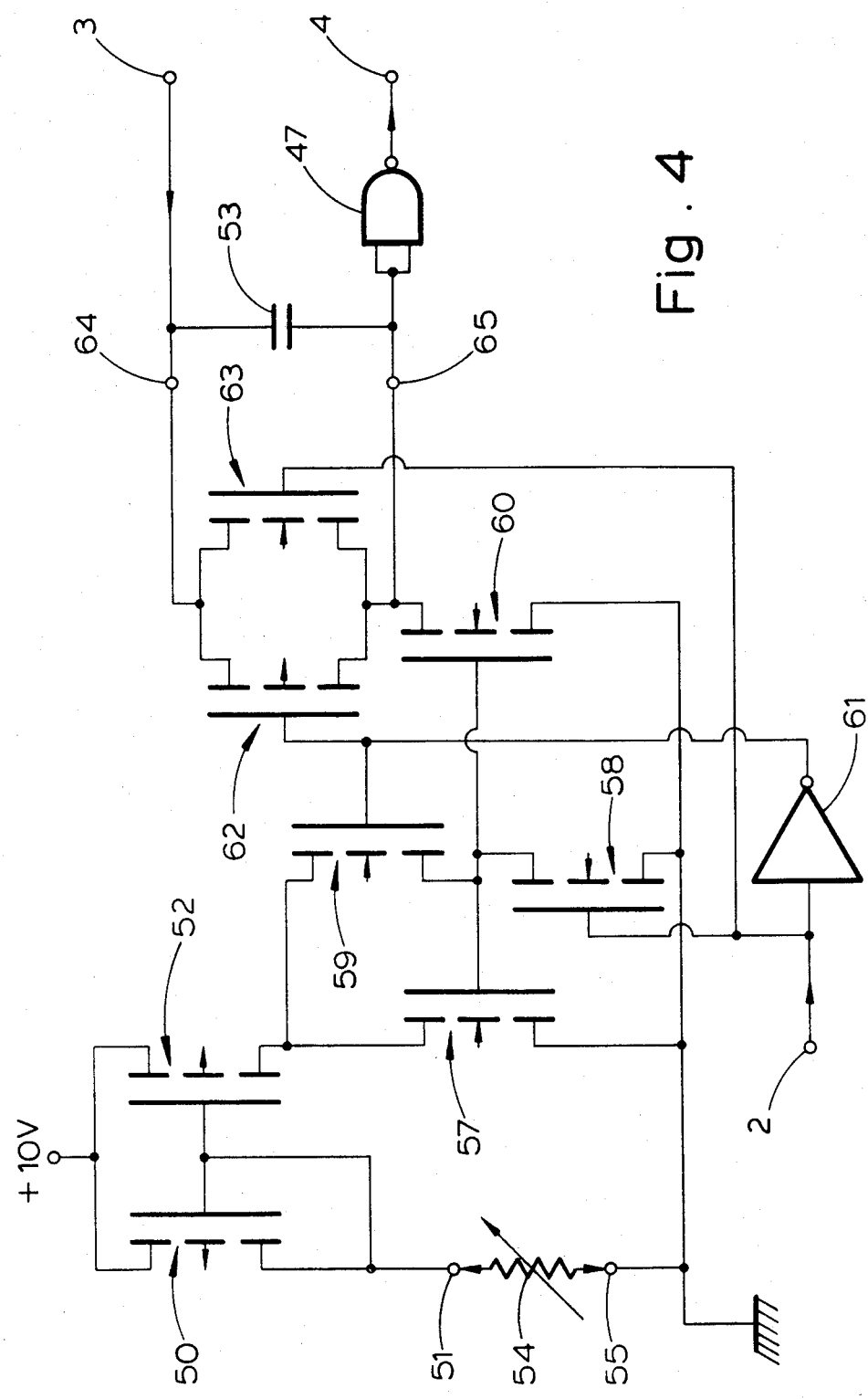
FIG. 4 shows a possible construction for the phase modulator.

FIG. 4 shows a possible construction for the phase modulator 1 of FIG. 3. The modulator is in the form of a CMOS or LOCMOS integrated circuit to which a variable resistor 54, a capacitor 53, and an inverter 47 are connected via terminal 51, 55, 64 and 65, and includes a constant current source in the form of a current mirror comprising two field-effect transistors (FETs) 50 and 52 fed from the ground supply line via resistor 54. The sources of the transistors 50 and 52 are connected to the +10 V supply line, their gates are commoned and connected to the drain of transistor 50 and to ground via resistor 54, and a constant current, the value of which is determined by the value of (adjustable) resistor 54, appears at the drain of transistor 52.

The output of the constant current source circuit 50, 52 and 54 is connected to the input of a second, switchable, current mirror circuit comprising FETs 57, 58, 59 and 60. More specifically the drain of transistor 52 is connected to the drains of the transistors 57 and 59, the source of transistor 59 being connected to the gates of the transistors 57 and 60. The sources of the transistors 57 and 60 are connected to ground, as is the source of the transistor 58. The drain of the transistor 58 is connected to the commoned gates of transistors 57 and 60. The carrier signal input terminal 2 is connected to the gate of transistor 58 directly and to the gate of transistor 59 via an inverter 61. When the potential at carrier signal input terminal 2 is low, transistor 59 is turned on and transistor 58 is turned off, and the drain current of transistor 52 appears in mirrored form at the drain of transistor 60. When, on the other hand, the potential at carrier signal input terminal 2 is high, transistor 60 is turned off.

The modulation signal input terminal 3 is connected to the terminal 64 side of the capacitor 53 and the output 4 of the modulator is taken from the terminal 65 side of the capacitor 53 via the inverter 47 (which may be a quarter of an integrated circuit available under the type number HEF 4011). The source-drain paths of a pair of FETs 62 and 63 of mutually opposite conductively type are connected across the capacitor 53, the source of transistor 62 and the drain of transistor 63 being connected to terminal 64, and the drain of transistor 62 and the source of transistor 63 being connected to terminal 65 and to the drain of transistor 60. The carrier signal input terminal 2 is connected to the gate of transistor 63 directly and to the gate of transistor 62 via the inverter 61. Thus, when the potential at terminal 2 is low, both transistors 62 and 63 are cut off, whereas when this potential is high, both transistors 62 and 63 are turned on.

Suppose that initially the potential at terminal 2 is high. Transistor 60 is off and transistors 62 and 63 are both on, so that the potential at output terminal 4 is equal to the potential at modulation signal input terminal 3 (the potential at the output 11 of integrator circuit 7 of FIG. 3). If now the potential at carrier signal input terminal 2 goes low, transistors 62 and 63 are cut off and transistor 60 carries a constant current determined by the value of resistor 54. Capacitor 53 therefore charges in a linear manner and a steadily decreasing voltage occurs at output terminal 4. When this voltage reaches the transition voltage of inverter 47, the voltage at output terminal 4 changes rapidly to logic 1 and remains there until the potential at terminal 2 goes high once again. It will be evident that the time taken for the potential at terminal 4 to go high after the potential at terminal 2 goes low, is directly proportional to the value at which the steady decrease in voltage at terminal 65 starts, i.e. on the value of the voltage at terminal 3. Thus, the circuit of FIG. 4 constitutes a phase modulator, the time elapsing between each negative-going transition of the voltage at carrier input terminal 2 and the resulting positive transition at output terminal 4, i.e. the phase lag produced, being directly proportional to the voltage at modulation signal input 3.

With the output frequency of 1 MHz quoted for the generator 18 of FIG. 3, the capacitor 53 of FIG. 4 may have a value of 3.3nF (1%, polystyrene) and the resistor 54 may have a (maximum) value of 22K ohms, the actual value of the latter being adjusted to give the required sensitivity.

In the interests of spectral purity of the output signals of the frequency modulators described, the amount by which the division factor of the divider 16 is changed each time the integrator circuit 7 output signal has passed the relevant threshold, is preferably chosen to be as small as possible, bearing in mind that it must be consistent with the maximum frequency deviation required. It is possible to modify, for example, the arrangement described with reference to FIG. 2 so that the amount by which the division factor is changed adjusts automatically to the deviation required at any instant.

To this end the arrangement of FIG. 2 may be provided with further threshold circuit/D-type flip-flop/controllable switch combinations similar to the combinations 12, 14, 20 and 25, 27, 28, the thresholds to which the further threshold circuits thus provided respond, differing from those to which the threshold circuits 12 and 25 respond and from each other. The divider 16 will then have to be provided with a further control input corresponding to each further flip-flip thus provided and connected to the output of the corresponding flip-flop, and be constructed to respond to the application of control signals to these further control inputs by operating with suitably chosen respective division factors. Each further controllable switch thus provided will have to be fed with a potential of the correct magnitude to result, when the corresponding switch is closed, in the output signal of the integrator circuit 7 being modified in the correct direction by an amount such as to result in a change in the phase shift produced by modulator 1 which exactly compensates for the steady phase shift produced by the change in the division factor of divider 16 when the relevant flip-flop produces an output signal.

Thus, for example, two further such threshold circuit/flip-flop/controllable switch combinations may be provided in the arrangement of FIG. 2 in such a manner that, for the first of these further combinations, the inverting input of the threshold circuit is fed with twice the positive voltage fed to terminal 26 (relative to the mean of the potentials at terminals 13 and 26) the output of the flip-flop is connected to a control input of divider 16, the application of a signal to which causes the division factor of the divider to be changed to N−2M, and the input to the controllable switch is supplied with twice the positive voltage fed to terminal 30. For the second of these combinations, the non-inverting input of the threshold circuit may be fed with twice the negative voltage fed to terminal 13 (relative to the mean of the potentials at terminals 13 and 26, the output of the flip-flop may be connected to a control input of divider 16 the application of a signal to which causes the division factor of the divider to be changed to N+2M, and the input to the controllable switch may be supplied with twice the negative voltage fed to terminal 21.

Because the construction for the phase modulator 1 of FIG. 3, shown in FIG. 4, operates by delaying the carrier signal edges by a modulation-signal-dependent amount, it will be evident that the change in the phase shift produced thereby occurring when switch 20 or 28 is closed, will only be the required amount when the output frequency of generator 18 has a specific value. If the frequency modulator arrangement is required to operate with a range of input carrier frequencies, a different construction for the phase modulator 1 will have to be employed, for example as described in copending U.S. patent application Ser. No. 226,326, filed Jan. 19, 1981.

Although in the embodiments described, each change in the division factor of divider 16 between a given pair of values, for example between N and N+M, has been described as occurring in response to the output of integrator circuit 7 crossing the same threshold (albeit in different directions) regardless of whether the change is from N to N+M or from N+M to N, it will be evident that this is not necessarily the case; the change from N to N+M may occur in response to the integrator circuit output signal crossing a first relatively high threshold and the change from N+M to N may occur in response to the integrator circuit output signal crossing a second relatively low threshold. In other words, the threshold-responsive devices may exhibit hysteresis. The comparators 12 and 25 of FIG. 3 will tend, in practice, to exhibit some hysteresis in any case.

FIG. 7 is a schematic circuit diagram similar to that of FIG. 3, but showing the amplifiers 12, 25 connected to operate as a threshold-responsive devices having first, second and third, fourth thresholds, respectively. Specifically, resistors 70, 72, 80, 82 are connected to the amplifiers 12, 25 and the divider 38-41 as shown. The resistances of the resistors 70, 72, 80, 82 are primarily a matter of design choice depending upon the specific thresholds desired. However, as is known in the art, the resistance of the resistor 70 preferably is approximately ten times the resistance of the resistor 72. As is also known in the art, the total resistance of the resistors 70, 72 should be high (e.g. several orders of magnitude higher) as compared to the resistance of each resistor of the divider 38-41 so that the effect of a change in the output level of the amplifier 12 on the potentials along the divider is minimized. Identical comments apply to resistors 80, 82 connected to the amplifier 25.

We claim:

1. A frequency modulator circuit arrangement comprising a phase modulator having a first input for a carrier signal, a second input for a modulation signal, and an output for the modulated carrier signal, and an integrator circuit having its output coupled to said second input of said phase modulator for providing the modulation signal, characterized in that the arrangement includes a variable-division-factor frequency divider in a signal path to the first input of the phase modulator and a control circuit for controlling the division factor of said frequency divider and for adjusting the value of the output signal of the integrator circuit, said control circuit comprising a threshold-responsive device having an input to which the output of the integrator circuit is coupled, said control circuit (a) controlling the division factor of the divider in accordance with the value of the integrator circuit output signal in such manner that said division factor will be controlled to a first value in response to the integrator circuit output signal crossing the threshold of said threshold-responsive device in a given direction and will be controlled to a second value in response to said integrator circuit output signal crossing the threshold of said threshold-responsive device in the opposite direction, and (b) adjusting said integrator circuit output signal in said given direction by a predetermined amount, relative to the value which it would otherwise have, each time a division cycle is performed by the divider when its division factor has the second value; said first and second values of the division factor having such a relationship, and said predetermined amount of said integrator circuit output signal having such a magnitude that the change in phase of the output signal of the frequency divider/phase modulator combination, which would otherwise be produced as a result of each said division cycle being performed by said divider when the division factor has said second value after a change in said division factor from said first value to said second value, will be substantially compensated for by the change in the phase shift produced by said phase modulator occurring in response to each such adjustment of the integrator circuit output signal by said predetermined amount relative to the phase shift that the phase modulator would otherwise have produced, at least when the divider/phase modulator combination is fed with a carrier signal having a given frequency.

2. An arrangement as claimed in claim 1, wherein the control circuit comprises a further threshold-responsive device having an input to which the output of the integrator circuit is coupled, and wherein said control circuit is constructed to furthermore control the division factor of the divider in accordance with the value of the integrator circuit output signal in such manner that said division factor will be controlled to a third value in response to said integrator circuit output signal crossing the threshold of said further threshold-responsive device in said given direction and will be controlled to said first value in response to said integrator circuit output signal crossing the threshold of said further threshold-responsive device in said opposite direction and to adjust said integrator circuit output signal in said opposite direction by a second predetermined amount, relative to the value which it would otherwise have, each time a division cycle is performed by the divider when its division factor has the third value; said first value lying between said second and third values and said second predetermined amount having such a magnitude that the change in phase of the output signal of the frequency divider/phase modulator combination, which would otherwise be produced by the performance of each said division cycle when the division factor has said third value after a change in said division factor from said first value to said third value, will be substantially compensated for by the change in the phase shift produced by the phase modulator occurring in response to each such adjustment in the value of the integrator circuit output signal by said second predetermined amount relative to the phase shift that the phase modulator would otherwise have produced, at least when the divider/phase modulator combination is fed with a carrier signal having said given frequency, the threshold of the further threshold-responsive device having such a relationship to the threshold of said threshold-responsive device that a change in the integrator circuit output signal from the threshold of the threshold-responsive device to the threshold of the further threshold-responsive device will be in said given direction.

3. An arrangement as claimed in claim 2, characterized in that the control circuit includes the series combination of a controllable switch and a resistor connecting a point of constant potential to said integrator circuit, and means for closing said switch only while the division factor has its second value so that, while the division factor has its second value, current will continuously flow in said series combination in a direction tending to change the integrator circuit output signal in said given direction.

4. An arrangement as claimed in claim 3, characterized in that the control circuit includes the series combination of a second controllable switch and said resistor connecting a second point of constant potential to said integrator circuit, and means for closing said second switch only while the division factor has its third value so that, while the division factor has its third value, current will continuously flow in said second series combination in a direction tending to change the integrator circuit output signal in said opposite sense.

5. An arrangement as claimed in claim 2, wherein said threshold-responsive device has, in addition to said threshold herein designated as the first threshold, a second threshold, characterized in that said control circuit controls the division factor of said frequency divider to said first value in response to the output signal of said integrator circuit crossing said first threshold in said given direction and to said second value in response to the output signal of said integrator circuit crossing said second threshold in said opposite direction, said second threshold having such a relationship to said first threshold that a change in the integrator circuit output signal to said second threshold from said first threshold is in said opposite direction.

6. An arrangement as claimed in claim 5, characterized in that the control circuit includes a series combination of a controllable switch and a resistor connecting a point of constant potential to said integrator circuit, and means for closing said switch only while the division factor has its second value so that, while the division factor has its second value, current will continuously flow in said series combination in a direction tending to change the integrator circuit output signal in said given direction.

7. An arrangement as claimed in claim 1, characterized in that the control circuit includes the series combination of a controllable switch and a resistor connecting a point of constant potential to said integrator circuit, and means for closing said switch only while the division factor has its second value so that, while the division factor has its second value, current will continuously flow in said series combination in a direction tending to change the inntegrator circuit output signal in said given direction.

8. An arrangement as claimed in claim 1, wherein said threshold-responsive device has, in addition to said threshold herein designated as the first threshold, a second threshold, characterized in that said control circuit controls the division factor of said frequency divider to said first value in response to the output signal of said integrator circuit crossing said first threshold in said given direction and to said second value in response to the output signal of said integrator circuit crossing said second threshold in said opposite direction, said second threshold having such a relationship to said first threshold that a change in the integrator circuit output signal to said second threshold from said first threshold is in said opposite direction.

9. An arrangement as claimed in claim 8, characterized in that the control circuit includes a series combination of a controllable switch and a resistor connecting a point of constant potential to said integrator circuit, and means for closing said switch only while the division factor has its second value so that, while the division factor has its second value, current will continuously flow in said series combination in a direction tending to change the integrator circuit output signal in said given direction.

10. A frequency modulator circuit arrangement comprising a phase modulator having a first input for a carrier signal, a second input for a modulation signal, and an output for the modulated carrier signal, and an integrator circuit having its output coupled to said second input of said phase modulator for providing the modulation signal, characterized in that the arrangement includes a variable-division-factor frequency divider in a signal path to the first input of the phase modulator, and a control circuit for controlling the division factor of said frequency-divider and for adjusting the value of the output signal of the integrator circuit, said control circuit comprising first and second threshold-responsive devices which each have an input to which the output of the integrator circuit is coupled and which devices are responsive to first and second thresholds and to third and fourth thresholds, respectively, said control circuit (a) controlling the division factor of the divider in accordance with the value of the integrator circuit output signal in such manner that said division factor will be controlled to a first value in response to said integrator circuit output signal crossing said first threshold in a given direction, to a second value in response to said integrator circuit output signal crossing said second threshold in the opposite direction, to a third value in response to said integrator circuit output signal crossing said fourth threshold in said given direction, and to said second value in response to said integrator circuit output signal crossing said third threshold in said opposite direction, (b) adjusting said integrator circuit output signal in said given direction by a predetermined amount, relative to the value it would otherwise have, each time a division cycle is performed by the divider when its division factor has the second value, said first and second values having such a relationship, and said predetermined amount of said integrator circuit output signal having such a magnitude that the change in phase of the output signal of the frequency divider/phase modulator combination, which would otherwise be produced as a result of each said division cycle being performed by said divider when the division factor has the second value after a change in said division factor from said first value to said second value, will be substantially compensated for by the change in the phase shift produced by said phase modulator occurring in response to each such adjustment of the integrator circuit output signal by said predetermined amount relative to the phase shift that the phase modulator would otherwise have produced, at least when the divider/phase modulator combination is fed with a carrier signal having a given frequency, and (c) adjusting said integrator cirucit output signal in said opposite direction by a second predetermined amount, relative to the value which it would otherwise have, each time a division cycle is performed by the divider when its division factor has the third value, said first value lying between said second and third values and said second predetermined amount of said integrator circuit output signal having such a magnitude that the change in phase of the output signal of the frequency divider/phase modulator combination, which would otherwise be produced as a result of each said division cycle being performed by said divider when the division factor has said third value after a change in said division factor from said first value to said third value, will be substantially compensated for by the change in the phase shift produced by to phase modulator occurring in response to each such adjustment in the value of the integrator circuit output signal by said second predetermined amount relative to the phase shift that the phase modulator would otherwise have produced, at least when the divider/phase modulator combination is fed with a carrier signal having said given frequency, said first threshold having such a relationship to said second threshold that a change in said integrator circuit output signal from said second threshold to said first threshold will be in said given direction, said third threshold having such a relationship to said fourth threshold that a change in said integrator circuit output signal from said fourth threshold to said third threshold will be in said opposite direction, and said fourth threshold having such a relationship to said second threshold that a change in said integrator circuit output signal from said second threshold to said fourth threshold will be in said given direction.

11. An arrangement as claimed in claim 10, characterized in that the control circuit includes a series combination of a controllable switch and a resistor connecting a point of constant potential to said integrator cirucit, and means for closing said switch only while the division factor has its second value so that, while the division factor has its second value, current will continuously flow in said series combination in a direction tending to change the integrator circuit output signal in said given direction.

12. An arrangement as claimed in claim 11, characterized in that the control circuit includes a second series combination of a second controllable switch and said resistor connecting a second point of constant potential to said integrator circuit, and means for closing said second switch only while the division factor has its third value so that, while the division factor has its third value, current will continuously flow in said second series combination in a direction tending to change the integrator circuit output signal in said opposite direction.

13. An arrangement as claimed in any one of the claims 1–12, wherein the control circuit is constructed to respond to the value of the integrator circuit output signal only once during each cycle of the output signal of the frequency divider/phase modulator combination.

14. A frequency modulator circuit arrangement comprising a phase modulator having a first input for a carrier signal, a second input for a modulation signal, and an output for the modulated carrier signal, and an integrator circuit having its output coupled to said second input of said phase modulator for providing the modulation signal, characterized in that the arrangement includes a variable-division-factor frequency divider in a signal path from the output of the phase modulator, and a control circuit for controling the division factor of said frequency divider and for adjusting the value of the output signal of the integrator circuit, said control circuit comprising a threshold-responsive device having an input to which the output of the integrator circuit is coupled, said control circuit (a) controlling the division factor of the divider in accordance with the value of the integrator circuit output signal in such manner that said division factor will be controlled to a first value in response to the integrator circuit output signal crossing the threshold of said threshold-responsive device in a given direction and will be controlled to a second value in response to said integrator circuit output signal crossing the threshold of said threshold-responsive device in the opposite direction, and (b) adjusting said integrator circuit output signal in said given direction by a predetermined amount, relative to the value which it would otherwise have, each time a division cycle is performed by the divider when its division factor has the second value; said first and second values of the division factor having such a relationship, and said predetermined amount of said integrator circuit output signal having such a magnitude that the change in phase of the output signal of the frequency divider/phase modulator combination, which would otherwise be produced as a result of each said division cycle being performed by said divider when the division factor has said second value after a change in said division factor from said first value to said second value, will be substantilly compensated for by the change in the phase shift produced by said phase modulator occurring in response to each such adjustment of the integrator circuit output signal by said predetermined amount relative to the phase shift that the phase modulator would otherwise have produced, at least when the divider/phase modulator combination is fed with a carrier signal having a given frequency.

15. An arrangement as claimed in claim 14, wherein said threshold-responsive device has, in addition to said threshold herein designated as the first threshold, a second threshold, characterized in that said control circuit controls the division factor of said frequency divider to said first value in response to the output signal of said integrator circuit crossing said first threshold in said given direction and to said second value in response to the output signal of said integrator circuit crossing said second threshold in said opposite direction, said second threshold having such a relationship to said first threshold that a change in the integrator circuit output signal to said second threshold from said first threshold is in said opposite direction.

16. A frequency modulator circuit arrangement comprising a phase modulator having a first input for a carrier signal, a second input for a modulation signal, and an output for the modulated carrier signal, and an integrator circuit having its output coupled to said second input of said phase modulator for providing the modulation signal, characterized in that the arrangement includes a variable-division-factor frequency divider in a signal path from the output of the phase modulator, and a control circuit for controlling the division factor of said frequency-divider and for adjusting the value of the output signal of the integrator circuit, said control circuit comprising first and second threshold-responsive devices which each have an input to which the output of the integrator circuit is coupled and which devices are responsive to first and second thresholds and to third and fourth thresholds, respectively, said control circuit (a) controlling the division factor of the divider in accordance with the value of the integrator circuit output signal in such manner that said division factor will be controlled to a first value in response to said integrator circuit output signal crossing said first threshold in a given direction, to a second value in response to said integrator circuit output signal crossing said second threshold in the opposite direction, to a third value in response to said integrator circuit output signal crossing said fourth threshold in said given direction, and to said second value in response to said integrator circuit output signal crossing said third threshold in said opposite direction, (b) adjusting said integrator circuit output signal in said given direction by a predetermined amount, relative to the value it would otherwise have, each time a division cycle is performed by the divider when its division factor has the second value, said first and second values having such a relationship, and said predetermined amount of said integrator circuit output signal having such a magnitude that the change in phase of the output signal of the frequency divider/phase modulator combination, which would otherwise be produced as a result of each said division cycle being performed by said divider when the division factor has the second value after a change in said division factor from said first value to said second value, will be substantially compensated for by the change in the phase shift produced by said phase modulator occurring in response to each such adjustment of the integrator circuit output signal by said predetermined amount relative to the phase shift that the phase modulator would otherwise have produced, at least when the divider/phase modulator combination is fed with a carrier signal having a given frequency, and (c) adjusting said integrator circuit output signal in said opposite direction by a second predetermined amount, relative to the value which it would otherwise have, each time a division cycle is performed by the divider when its division factor has the third value, said first value lying between said second and third values and said second predetermined amount of said integrator circuit output signal having such a magnitude that the change in phase of the output signal of the frequency divider/phase modulator combination, which would otherwise be produced as a result of each said division cycle being performed by said divider when the division factor has said third value after a change in said division factor from said first value to said third value, will be substantially compensated for by the change in the phase shift produced by the phase modulator occurring in response to each such adjustment in the value of the integrator circuit output signal by said second predetermined amount relative to the phase shift that the phase modulator would otherwise have produced, at least when the divider/phase modulator combination is fed with a carrier signal having said given frequency, said first threshold having such a relationship to said second threshold that a change in said integrator circuit output signal from said second threshold to said first threshold will be in said given direction, said third threshold having such a relationship to said fourth threshold that a change in said integrator circuit output signal from said fourth threshold to said third threshold will be in said opposite direction, and said fourth threshold having such a relationship to said second threshold that a change in said integrator circuit output signal from said second threshold to said fourth threshold will be in said given direction.

* * * * *